United States Patent
Markowski et al.

(10) Patent No.: US 7,808,313 B2
(45) Date of Patent: Oct. 5, 2010

(54) POWER SUPPLY PROVIDING ULTRAFAST MODULATION OF OUTPUT VOLTAGE

(75) Inventors: Piotr Markowski, Ansonia, CT (US); Lin Guo Wang, Nanjing (CN)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 12/417,859

(22) Filed: Apr. 3, 2009

(65) Prior Publication Data

US 2009/0184764 A1 Jul. 23, 2009

Related U.S. Application Data

(62) Division of application No. 11/869,121, filed on Oct. 9, 2007.

(60) Provisional application No. 60/894,570, filed on Mar. 13, 2007.

(51) Int. Cl.
*H03G 3/20* (2006.01)
(52) U.S. Cl. ........................ 330/136; 330/297
(58) Field of Classification Search ................. 330/136, 330/297
See application file for complete search history.

(56) References Cited

U.S. PATENT DOCUMENTS

| | | | |
|---|---|---|---|
| 3,600,667 A | 8/1971 | Wynn | |
| 3,970,953 A | 7/1976 | Walker et al. | |
| 4,378,530 A | 3/1983 | Garde | |
| 4,502,152 A | 2/1985 | Sinclair | |
| 4,516,080 A | 5/1985 | Garde | |
| 5,682,303 A | 10/1997 | Goad | |
| 5,905,407 A | 5/1999 | Midya | |
| 5,939,867 A | 8/1999 | Capici et al. | |
| 6,009,000 A | 12/1999 | Siri | |
| 6,043,707 A | 3/2000 | Budnik | |
| 6,121,761 A | 9/2000 | Herbert | |
| 6,215,290 B1 | 4/2001 | Yang et al. | |
| 6,281,666 B1 | 8/2001 | Tressler et al. | |

(Continued)

FOREIGN PATENT DOCUMENTS

WO        WO 00/08750 A1        2/2000

(Continued)

OTHER PUBLICATIONS

Asbeck et al., "Synergistic Design of DSP and Power Amplifiers for Wireless Communications", IEEE Transactions on Microwave Theory and Techniques, Nov. 2001, vol. 49, No. 11, pp. 2163-2169.

(Continued)

*Primary Examiner*—Khanh V Nguyen
(74) *Attorney, Agent, or Firm*—K&L Gates LLP

(57) ABSTRACT

A circuit for use with a power amplifier that amplifies an input signal. The circuit may comprise an amplitude correction circuit and an open-loop switching regulator. The amplitude correction circuit may be configured to generate a corrected envelope signal from an input envelope signal that represents an envelope of the input signal. The open-loop switching regulator may be connected to the amplitude correction circuit and may be for powering the power amplifier based on the corrected envelope signal. According to various embodiments, the corrected envelope signal generated by the amplitude correction circuit is a function of the input envelope signal and an error voltage of the open-loop switching regulator.

14 Claims, 14 Drawing Sheets

U.S. PATENT DOCUMENTS

| | | | |
|---|---|---|---|
| 6,292,378 B1 | 9/2001 | Brooks et al. | |
| 6,300,826 B1 | 10/2001 | Mathe et al. | |
| 6,346,798 B1 | 2/2002 | Passoni et al. | |
| 6,362,607 B1 | 3/2002 | Wickersham et al. | |
| 6,362,608 B1 | 3/2002 | Ashburn et al. | |
| 6,404,175 B1 | 6/2002 | Yang et al. | |
| 6,424,129 B1 | 7/2002 | Lethellier | |
| 6,449,174 B1 | 9/2002 | Elbanhawy | |
| 6,509,722 B2 | 1/2003 | Lopata | |
| 6,534,962 B1 | 3/2003 | Lee | |
| 6,583,664 B2 | 6/2003 | Mathe et al. | |
| 6,642,631 B1 | 11/2003 | Clavette | |
| 6,650,096 B2 | 11/2003 | Lee | |
| 6,661,210 B2 | 12/2003 | Kimball et al. | |
| 6,674,274 B2 | 1/2004 | Hobrecht et al. | |
| 6,781,452 B2 | 8/2004 | Cioffi et al. | |
| 6,825,726 B2 | 11/2004 | French et al. | |
| 6,833,760 B1 | 12/2004 | Aude | |
| 6,850,045 B2 | 2/2005 | Muratov et al. | |
| 6,992,353 B1 | 1/2006 | Wu | |
| 7,058,373 B2 | 6/2006 | Grigore | |
| 7,071,662 B2 | 7/2006 | Hsu et al. | |
| 7,091,777 B2 * | 8/2006 | Lynch | 330/136 |
| 7,109,689 B2 | 9/2006 | Schneider | |
| 7,116,946 B2 * | 10/2006 | Tanabe et al. | 455/91 |
| 7,126,315 B2 | 10/2006 | Seo | |
| 7,126,317 B2 | 10/2006 | Schreck | |
| 7,183,755 B2 | 2/2007 | Itoh et al. | |
| 7,183,856 B2 | 2/2007 | Miki et al. | |
| 7,190,150 B2 | 3/2007 | Chen et al. | |
| 7,229,886 B2 | 6/2007 | Lotfi et al. | |
| 7,499,502 B2 * | 3/2009 | Morimoto et al. | 375/297 |
| 7,551,688 B2 | 6/2009 | Matero et al. | |
| 7,583,149 B2 * | 9/2009 | Funaki et al. | 330/297 |
| 7,602,155 B2 | 10/2009 | Markowski | |
| 2005/0110562 A1 | 5/2005 | Robinson et al. | |
| 2006/0119425 A1 | 6/2006 | Phillips et al. | |
| 2007/0019446 A1 | 1/2007 | O'Loughlin | |
| 2007/0024360 A1 | 2/2007 | Markowski | |
| 2007/0126408 A1 | 6/2007 | Sakai | |
| 2008/0030174 A1 | 2/2008 | Niiyama | |
| 2008/0224769 A1 | 9/2008 | Markowski | |
| 2008/0237705 A1 | 10/2008 | Theeuwen et al. | |
| 2009/0091305 A1 | 4/2009 | Markowski | |

FOREIGN PATENT DOCUMENTS

WO    WO 2007/107728 A1    9/2007

OTHER PUBLICATIONS

Ertl et al., "Basic Considerations and Topologies of Switched-Mode Assisted Linear Power Amplifiers," Proc. of the 11th Applied Power Electronics Conference, IEEE, 1996, pp. 207-213.

Hu et al., "Switch-Linear-Hybrid Power Converter and Its Application Prospect in Industry," IEEE, 2006, pp. 1009-1014.

Kashiwagi, Seigoh, "A High-Efficiency Audio Power Amplifier Using a Self-Oscillating Switching Regulator," IEEE Transactions on Industry Applications, Jul./Aug. 1985, vol. IA-21, No. 4, pp. 906-911.

Notice of Allowance issued on Mar. 11, 2009 in U.S. Appl. No. 11/190,642.

Office Action issued on Jun. 12, 2007 in U.S. Appl. No. 11/190,642.
Office Action issued on May 5, 2008 in U.S. Appl. No. 11/190,642.
Office Action issued on Nov. 21, 2007 in U.S. Appl. No. 11/190,642.
Office Action issued on Oct. 30, 2008 in U.S. Appl. No. 11/190,642.
Restriction Requirement issued on Mar. 5, 2009 in U.S. Appl. No. 11/869,121.

Sahu et al., "A High-Efficiency Linear RF Power Amplifier with a Power-Tracking Dynamically Adaptive Buck-Boost Supply," IEEE Transactions on Microwave Theory and Techniques, Jan. 2004, vol. 52, No. 1, pp. 112-120.

Sahu et al., "System-Level Requirements of DC-DC Converters for Dynamic Power Supplies of Power Amplifiers", 2002 IEEE Asia-Pacific Conference on ASICS, 4 pages.

van der Zee et al., "A Power Efficient Audio Amplifier Combining Switching and Linear Techniques," Proc. of the 24th European Solid-State Circuits Conference, 1998, pp. 288-291.

Yousefzadeh et al., "Band Separation and Efficiency Optimization in Linear-Assisted Switching Power Amplifiers," Proc. of the 37th Power Electronics Specialists Conference, 2006, 7 pages.

Yundt, George B., "Series Parallel Connected Composite Amplifiers," Jun. 1983, Master Thesis, Massachusetts Institute of Technology, pp. 1-359.

Zhou et al., "Switch-Linear Hybrid Power Conversion (I)—The Topologies Based on Source Follower," IEEE, 2006, 7 pages.

Advisory Action Before the Filing of an Appeal Brief issued Aug. 14, 2008 in U.S. Appl. No. 11/190,642.

Restriction Requirement issued on Apr. 27, 2007 in U.S. Appl. No. 11/190,642.

Supplemental Notice of Allowability issued on Aug. 13, 2009 in U.S. Appl. No. 11/190,642.

Office Action issued on Jul. 22, 2009 in U.S. Appl. No. 11/869,121.
Restriction Requirement issued on Aug. 12, 2009 in U.S. Appl. No. 11/868,667.

Office Action issued on Oct. 9, 2009 in U.S. Appl. No. 11/868,667.
Office Action issued on Feb. 24, 2010 in U.S. Appl. No. 11/868,667.
Notice of Allowance issued on Jan. 26, 2010 in U.S. Appl. No. 11/869,121.

European Search Report mailed Jan. 26, 2010 for Application No. 08712950.8, 4 pages.

Pritiskutch, John and Brett Hanson, Understanding LDMOS Device Fundamentals, STMicroelectronics Application Note AN1226, Jul. 2000, printed from http://www.st.com/stonline/books/pdf/docs/6968.pdf on Feb. 22, 2010, 4 pages.

Holland, P.M. and Igic, P.M., "An Alternative Process Architecture for CMOS Based High Side RESURF LDMOS Transistors", Proc. 25th International Conference on Microelectronics (MIEL 2006), May 14-17, 2006, retrieved from IEEE Xplore on Feb. 22, 2010, pp. 195-198, 4 pages.

Kimball et al., "50% PAE WCDMA Basestation Amplifier Implemented with GaN HFETs", Compound Semiconductor Integrated Circuit Symposium, 2005, CSIC '05, IEEE Palm Springs, CA, Oct. 30-Nov. 2, 2005, Piscataway, NJ, USA, IEEE, Oct. 30, 2005, 4 pages.

European Search Report mailed Feb. 19, 2010 for Application No. 10000151.0, 8 pages.

Larson et al., "Device and Circuit Approaches for Improved Wireless Communications Transmitters", IEEE Personal Communications, vol. 6, No. 5, Oct. 1999, pp. 18-23.

Adragna, Claudio, "AN1261 Application Note, Getting Familiar with the L6590 Family High-Voltage Fully Integrated Power Supply", Dec. 2001, 28 pages.

"L6569, L6569A, High Voltage Half Bridge Driver with Oscillator", Jun. 2000, 13 pages.

"SST823 SST824 High Speed N-Channel Lateral DMOS Switch Zener Protected", Linear Systems, Linear Integrated Systems, 2 pages.

"FSQ510, FSQ510H, and FSQ510M, Green Mode Fairchild Power Switch (FPS™) for Valley Switching Converter—Low EMI and High Efficiency", Fairchild Semiconductor®, Jan. 2009, 15 pages.

"NCP1000, NCP1001, NCP1002 Integrated Off-Line Switching Regulator", ON Semiconductor®, Semiconductor Components Industries, LLC, Jul. 2009, Rev. 10, 14 pages.

"CALMOS Technology, SD5000N High-Speed LDMOS Quad Fet Analog Switch Array", 3 pages.

"BCD Processes Overview", Towerjazz, 2 pages.

"TSMC High Voltage Technology", Taiwan Semiconductor Manufacturing Company Ltd., Apr. 2005, 4 pages.

Office Action issued on Apr. 13, 2010 in U.S. Appl. No. 11/869,121.

\* cited by examiner

POWER SUPPLY PROVIDING ULTRAFAST MODULATION OF OUTPUT VOLTAGE

PRIORITY CLAIM

This application is a divisional of U.S. patent application Ser. No. 11/869,121, filed on Oct. 9, 2007, which is incorporated herein by reference and claims the benefit of U.S. Provisional Application Ser. No. 60/894,570, filed on Mar. 13, 2007, which is also incorporated herein by reference.

BACKGROUND

The present invention generally concerns power conversion circuits.

A number of different electronic devices require very fast modulation of their supply voltage. One such type of electronic devices is radio frequency (rf) linear power amplifiers. Such amplifiers are widely used in modern wireless communication devices and infrastructure. In complex modulation schemes commonly used in wireless communications like QPSK, CDMA, WCDMA, the amplitude of the envelope of the rf signal varies significantly. At every instance when the envelope of the rf signal is substantially lower than the maximum allowed by the supply voltage, the efficiency of the power amplifiers is severely reduced. In other words, a significant portion of the supply energy is expensed only for maintaining the power amplifier's operating point (bias) without creating useful signal. There are a number of adverse effects caused by this phenomenon, including (i) the need to oversize the expensive rf components in the amplifier system, (ii) increased cooling requirements, (iii) increased size and weight of equipment, and (iv) increased consumption of electrical energy. If, on the other hand, the supply voltage is changed in accordance with the envelope of the rf signal, the operating point of the power amplifiers can be kept at or near optimum at all times. As a result, efficiency can be maintained at a high level, regardless of the instantaneous amplitude of the envelope of the rf signal.

However, while rf power amplifiers ordinarily require very fast modulation of their supply voltage for improved efficiency, most available electronic energy sources are designed to maintain a constant, well-regulated output voltage and are required to vary their output voltage only at relatively slow rates. For example, the CDMA baseband frequency is 1.25 MHz and the WCDMA baseband frequency is 5 MHz. This results in an rf signal envelope having the most energy in the band 0-1.25 MHz and 0-5 MHz respectively. Multichannel amplifiers, on the other hand, experience envelope variations due to the interactions between different carrier frequencies. In such a situation, the rf signal envelope experiences amplitude variation with frequency components reaching the difference in carrier frequency of extreme channels (two channels with the greatest difference of the carrier frequency). The envelope frequency in this case can be on the order of hundreds of kHz to tens of MHz. If the bandwidth of the power supply is insufficient, distortion results and additional noise in the communication channels emerge, which results in an increased error rate in the communication channel. The present modulation rate goals are two to three orders of magnitude greater than what can be achieved by simply modulating a pwm signal of traditional dc-dc converters. This makes traditional pwm dc-dc converters unsuitable as power supplies for devices, such as rf power amplifiers, that require ultrafast modulation of their supply voltage.

FIG. 14 illustrates a prior art linear regulator 1400. The regulator 1400 includes a preamplifier stage 1402 and an output stage 1404. The preamplifier stage 1402 includes a preamplifier 1406, which may include a set of discrete components, or may be realized as a fully integrated circuit. An input signal is provided to an input terminal 1401 of the preamplifier 1406. The output of the preamplifier 1406 is provided to a pair of discrete power transistors 1408, 1410 arranged in a push-pull configuration. The proper bias (dc operating point) of transistors 1408, 1410 is provided by a pair of regulated voltage generating circuits 1414, 1416. The voltage generated by the circuits 1414, 1416 is selected to cancel the non-active input voltage region of the transistors 1408, 1410 at low input voltage levels. The transistors 1408, 1410 are of opposite types. Transistor 1408 is an n-type power Field Effect Transistor (FET) or an npn-type power bipolar transistor, while transistor 1410 is a p-type power FET or a pnp-typ power bipolar transistor. An output terminal 1403 is provided at the junction between transistor 1408 and the transistor 1410. A feedback line 1412 provides a feedback signal to the preamplifier 1406, causing it to amplify the difference between the input and output voltages. When the output voltage of the preamplifier 1406 is below the input voltage, the output of the preamplifier 1406 goes up and the transistor 1408 is biased on, sourcing current to any load present at the output terminal 1403 and bringing the output voltage to the desired level. The transistor 1410 is in cut-off. When the output voltage of the preamplifier 1406 is above the input voltage, the output of the preamplifier 1406 goes down and the transistor 1410 is biased on, sinking current from any load present at the output terminal 1403 and thus bringing the output voltage to the desired level. The transistor 1408 is in cut-off.

SUMMARY

In one general aspects, embodiments of the present invention may be directed to a circuit for use with a power amplifier that amplifies an input signal. The circuit may comprise an amplitude correction circuit and an open-loop switching regulator. The amplitude correction circuit may be configured to generate a corrected envelope signal from an input envelope signal that represents an envelope of the input signal. The open-loop switching regulator may be connected to the amplitude correction circuit and may be for powering the power amplifier based on the corrected envelope signal. According to various embodiments, the corrected envelope signal generated by the amplitude correction circuit is a function of the input envelope signal and an error voltage of the open-loop switching regulator.

In another general aspect, the present invention may be directed to embodiments of a circuit for use with a power amplifier that amplifies an input signal. The circuit may comprise a first regulator, a second regulator and a summing circuit. The first regulator may be for providing a first power component proportional to an envelope of the input signal minus an offset. The second regulator may be for providing a second substantially constant power component that is substantially equal to the offset. The summing circuit may be electrically connected to the first regulator, the second regulator and configured to be connected to the power amplifier. According to various embodiments, the summing circuit may be for summing the first power component and the second power component and providing a result to power the power amplifier.

In yet another general aspect, the present invention may be directed to embodiments of a system comprising a switching regulator. The switching regulator may be configured to provide an output proportional to an envelope signal representing an envelope of an input signal; and periodically modify a switching frequency of the switching regulator.

In still another general aspect, the present invention may be directed to embodiments of a circuit for use with a power amplifier that amplifies an input signal. The circuit may comprise a switching regulator and a linear regulator connected to one another in parallel. The paralleled switching regulator and linear regulator may be configured to power the power amplifier. According to various embodiments, the linear regulator may comprise a preamplifier stage and first and second radio frequency (RF) transistors. The first RF transistor and the second RF transistor may be electrically connected in series between a positive supply voltage and a negative supply voltage. An output of the preamplifier stage may be provided to a biasing terminal of the first RF transistor and to a biasing terminal of the second RF transistor. Also, the linear regulator and the switching regulator may be responsive to an envelope signal that is related to an envelope of the input signal, and the output power from the paralleled linear regulator and switching regulator may be based on the envelope signal.

FIGURES

Various embodiments of the present invention are described herein by way of example in conjunction with the following figures, wherein:

FIG. 1 is a diagram of a power supply according to various embodiments of the present invention;

FIGS. 2(a)-(i) and FIGS. 3(a)-(i) are idealized waveforms demonstrating the operation of the power supply of FIG. 1 according to various embodiments of the present invention;

DETAILED DESCRIPTION

Figure 1:
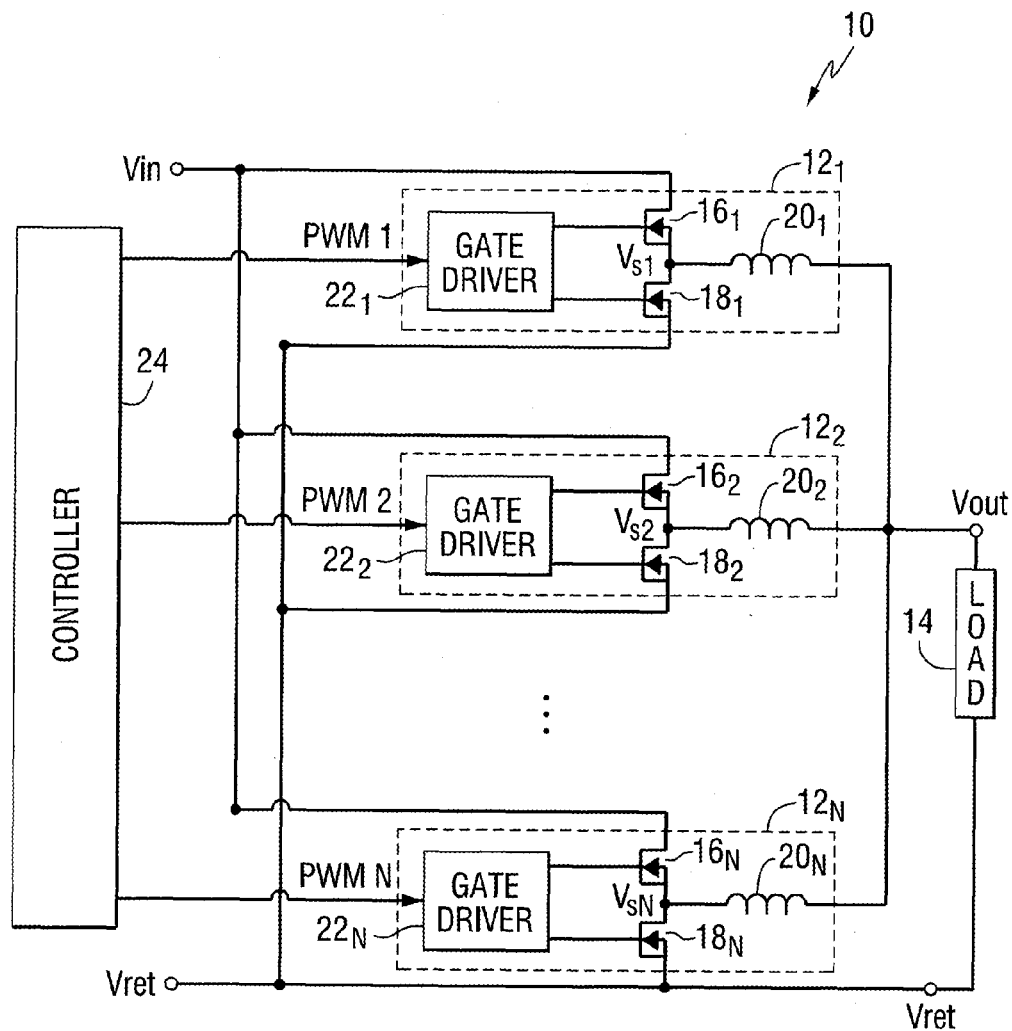

FIG. 1 is a diagram of a power supply 10 according to various embodiments of the present invention. The power supply 10 includes a number (N) of parallel-connected, switch-mode power modules $12_{1-N}$. The power modules $12_{1-N}$ may each convert a common input voltage (Vin) to respective output voltages of the same average amplitude, which allow the modules $12_{1-N}$ to be connected together (Vout) as shown in FIG. 1 to power a load 14.

Each of the power modules $12_{1-N}$ may be identical in structure but operated, as explained in more detail below, in a phase-shifted (or "interleaved") manner relative to each other. As shown in FIG. 1, according to one embodiment, each power module $12_{1-N}$ may include, for example, a synchronous buck converter. In that connection, the power modules $12_{1-N}$ may include, among other things, a power switch $16_{1-N}$, a synchronous rectifier $18_{1-N}$, an output inductor $20_{1-N}$ and a gate driver $22_{1-N}$ for providing the gate signals to the power switches $16_{1-N}$ and the synchronous rectifiers $18_{1-N}$. The converter 10 may also include a controller 24 for outputting PWM control signals to the respective power modules $12_{1-N}$ to control the on/off times of the power switches $16_{1-N}$ and the synchronous rectifiers $18_{1-N}$. The power processing operation of synchronous buck converters is known in the art and is, therefore, not further explained herein. In addition, it should be noted that other switch-mode topologies could be used for the power modules $12_{1-N}$. For example, the power modules $12_{1-N}$ may include other types of isolated or non-isolated buck or buck-derived power stages. Also, boost or buck-boost and/or current fed topologies may be used. The present invention accordingly is not limited to the synchronous bucks shown in FIG. 1.

Also, as shown in exemplary embodiment of FIG. 1, the power modules $12_{1-N}$ need not include a discrete output capacitor, as is included in most converter topologies. Thus, the output filter for the power supply 10 in such embodiments comprises only the inductance from the inductors $20_{1-N}$ and the implicit effective resistance of the load 14, neglecting the effect of parasitic capacitance, which is ordinarily inconsequential to the operation of the power supply 10.

The controller 24, according to various embodiments, may be implemented as a programmable digital controller. The power modules $12_{1-N}$ may alternatively connect the Vsi node ($1 \leq i \leq N$) of the power modules $12_{1-N}$ (see FIG. 1) to Vin or Vret depending on the logic level of the PWM signals supplied to the respective power modules $12_{1-N}$. Thus, at any give time, a certain number of power modules 12 will be in the forward state (i.e., Vsi equals Vin) and the rest will be in the freewheeling state (i.e., Vsi equals Vret) (neglecting transition states). During steady state operation all of the PWM control signals (PWM 1 to PWM N) may be characterized by the same duty cycle. The respective PWM signals, however, may be shifted in phase by a T/N relative to each other, where T is the switching period of the power modules $12_{1-N}$ and N is the number of modules.

The regulation of the output voltage (Vout) may be achieved by changing the number of power modules $12_{1-N}$ in the so-called "forward" state relative to the total number of power modules. Thus, the steady state output voltage of the power converter (neglecting transition from one stable voltage level to another) is equal to:

$$V\text{out}(t) = V\text{in} * k(t)/N \tag{1}$$

where N is the total number of power modules 12 (regardless of their state) and k(t) is the number of power modules 12 that are in the forward (or high) state at time t.

Figure 2:
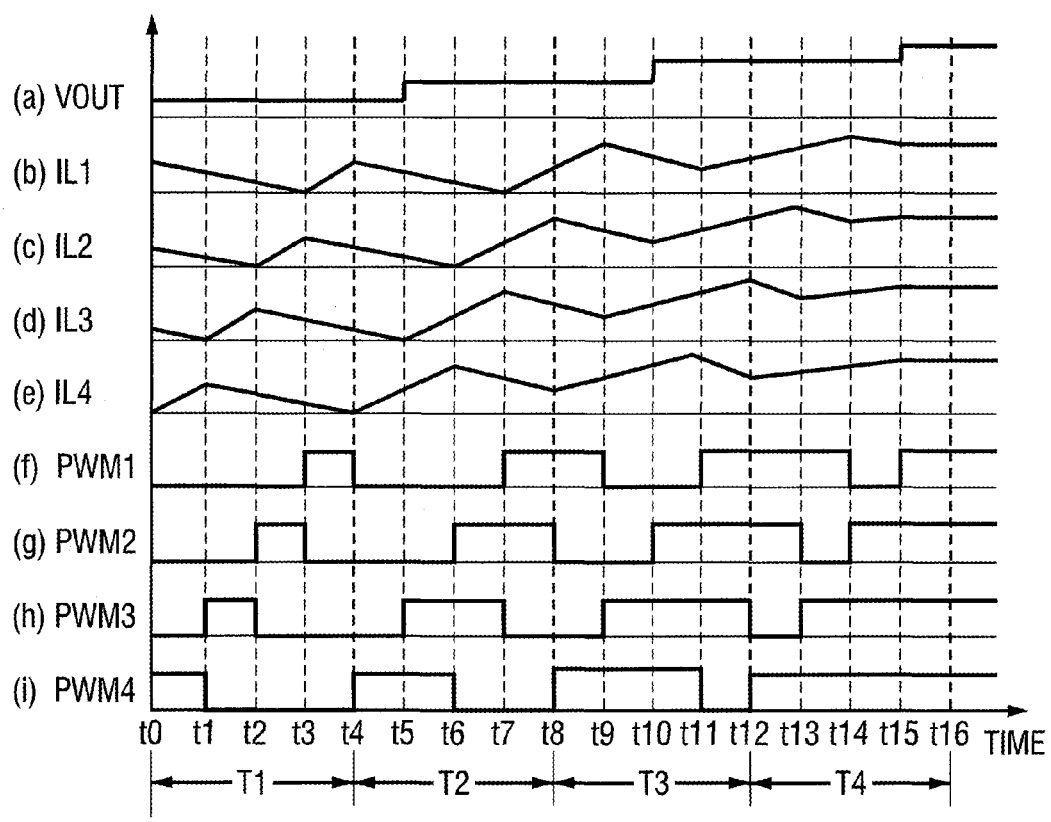

This operation can be understood through the idealized waveforms of FIGS. 2(a)-(i). In this example, the power supply 10 has four power modules (N=4), with each module 12 operated ninety (90) degrees of phase relative to the next module. The waveforms of FIGS. 2(f)-(i) show the PWM control signals for the respective power modules 12, the waveforms of FIGS. 2(b)-(e) show the current in the inductor 20 of each module 12, and the waveform of FIG. 2(a) shows the output voltage of the converter 10.

As can be seen, in time period T1 each power module has a duty cycle of 25%. As such, only one of the four modules 12 is in the forward (or high) state at any one time. Thus, the output voltage is one unit. During time period T2, each power module 12 has a duty cycle of 50%. As such, starting at time t5 and lasting until time t10, two of the four modules 12 are in the forward state at a time. The output voltage (Vout) is thus two units (i.e., twice as great as during time period t0 to t5). In time period T3, the duty cycle as 75% for each module 12. As a result, starting at time t10 and lasting until time t15, three of the four modules 12 are in the forward state at a time. The output voltage (Vout) is, therefore, three units (or three times greater than during time period t0 to t5). Thus, as can be seen in these waveforms, the output voltage can be varied by varying the duty cycle of the PWM signals to control the number of modules 12 in the forward state at any one time pursuant to equation (1) above.

Figure 3:
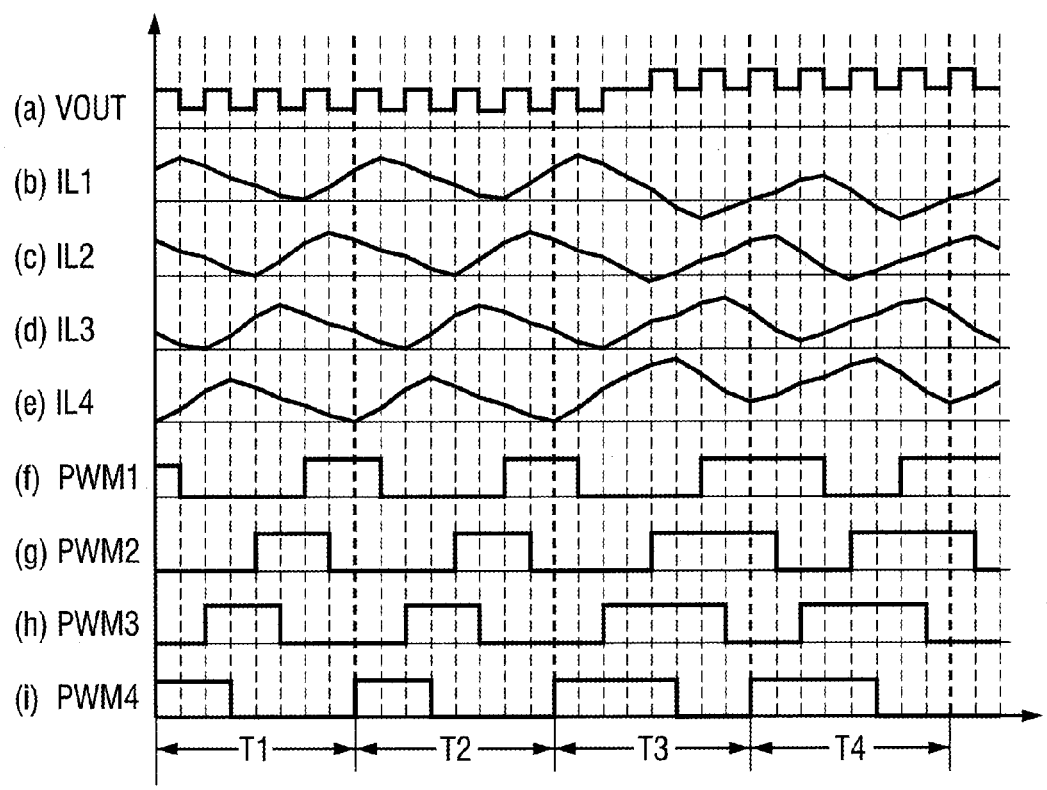

The waveforms of FIG. 3 show further design possibilities. In the waveforms of FIG. 3, the duty cycle (D) of the modules 12, unlike the situation in FIG. 2, does not belong to the finite set of values:

$$D_{set} = \{k/N\}$$

where N is total number of modules (N=4 in the example of FIG. 3) and k is any integer from 0 to N (i.e., $0 \leq k \leq N$). For example, in FIG. 3, during time periods T1 and T2, the duty cycle of the modules is 3/8=37.5%. Starting at time period T2, the duty cycle transitions to 5/8=62.5%. As can be seen in the waveform of FIG. 3(a), in such circumstances the output voltage oscillates between two adjacent stable levels determined by equation (1). Consequently, by providing a sufficiently large number of power modules 12, arbitrarily low voltage amplitudes and intra-level oscillations can be achieved. Further, the rate of modulation of the output voltage can exceed the switching frequency (f=1/T, where T is the switching period) of the power modules 12. This makes embodiments of the power supply 10 of FIG. 1 suitable for the dynamic source voltage requirements of rf linear power amplifiers and other applications that require fast source voltage modulation.

Figure 4:
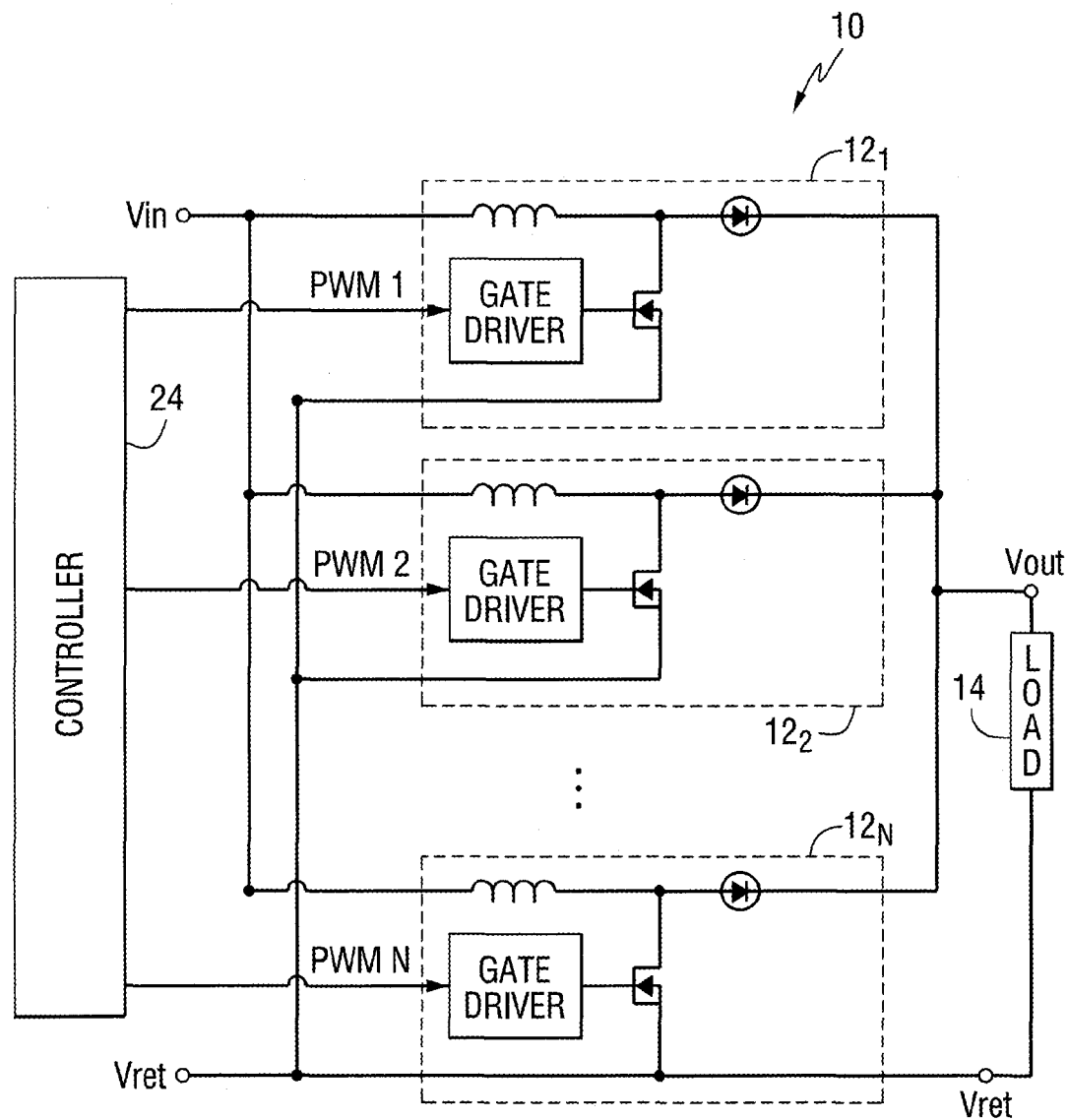
FIGS. 4 and 5 are diagrams of the power supply according to other embodiments of the present invention.
Figure 5:
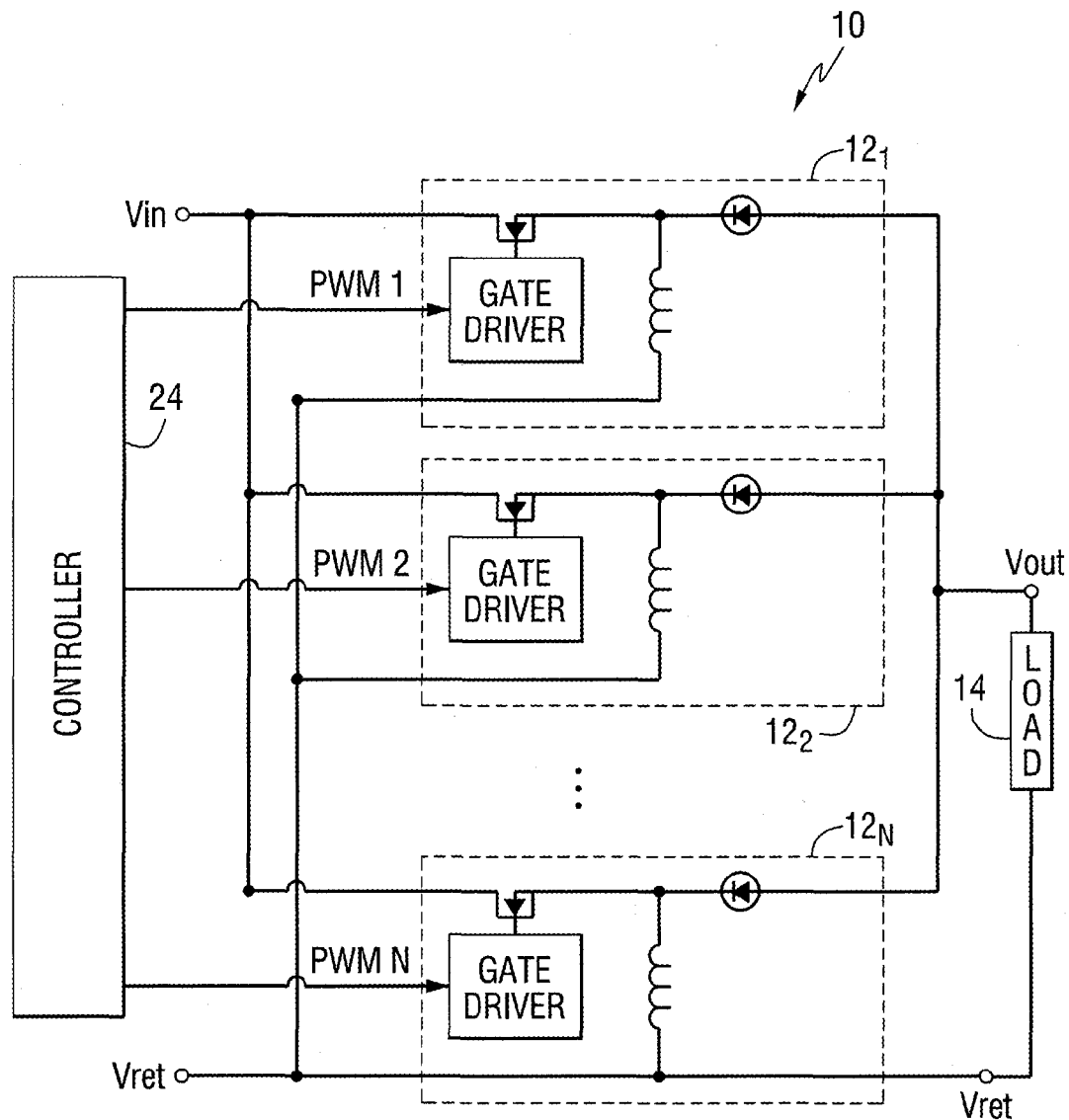

FIG. 4 is a diagram of an embodiment of the power supply 10 using boost converters as the power modules 12. Synchronous boost converter could be used in yet other embodiments. FIG. 5 is a diagram of an embodiment using buck-boost converters as the power modules 12. Again, synchronous buck-boost converters could be used in other embodiments. Also, converter topologies derived from these topologies may be used.

Figure 6:
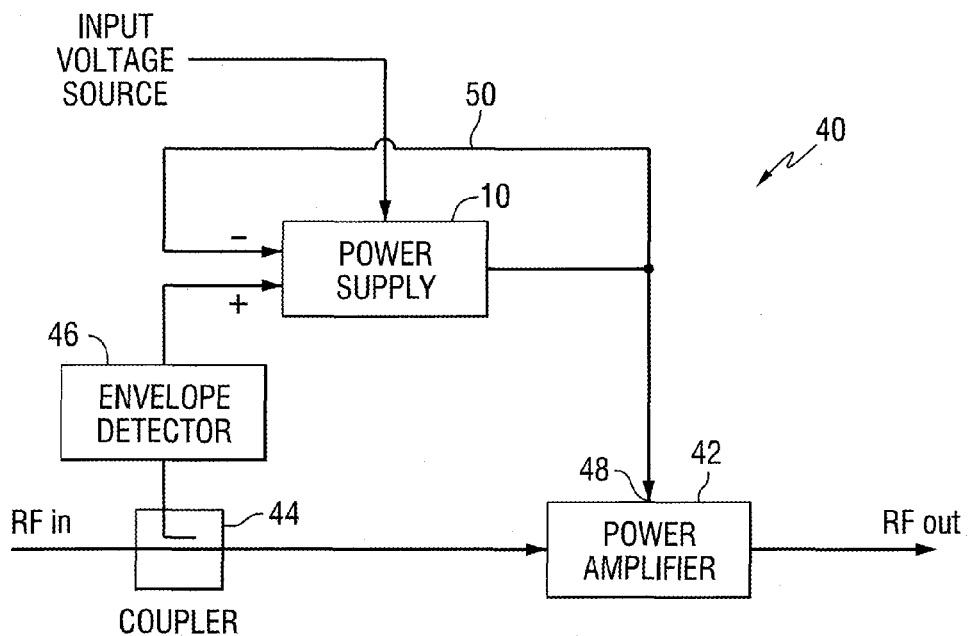
FIGS. 6-13 are block diagrams of power amplifier systems according to various embodiments of the present invention.

FIG. 6 is a simplified block diagram of a power amplifier system 40 according to various embodiments of the present invention. The power amplifier 42 amplifies an input rf signal (RF in) to produce an output rf signal (RF out). The power amplifier 42 may have one or many amplification stages. A sample of the rf input signal is coupled, via a coupler 44, to an envelope detector 46. The envelope detector 46 detects the envelope of the input rf signal. According to various embodiments, the envelope detector 46 may be omitted and the required voltage (or current) may be derived directly from the baseband signal, digital or analog. The voltage supplied by the power supply 10 to the power amplifier 42 via a supply voltage input 48 is proportional to the detected envelope signal. A feedback signal 50 is added to compensate for the error introduced by the power supply 10. Thus, the system 40 of FIG. 6 may be considered to have a "closed-loop" power supply 10. As described above, the power supply 10 may modulate the supply voltage applied to the power amplifier 42 to match the dynamic input supply voltage requirements of the power amplifier 42. For purposes of simplicity, other well-known components of a power amplifier system are not shown in FIG. 6. Additional modifications of the supply voltage may also be performed to achieve other objects for the system, such as linearity or a certain distortion level.

Figure 7:
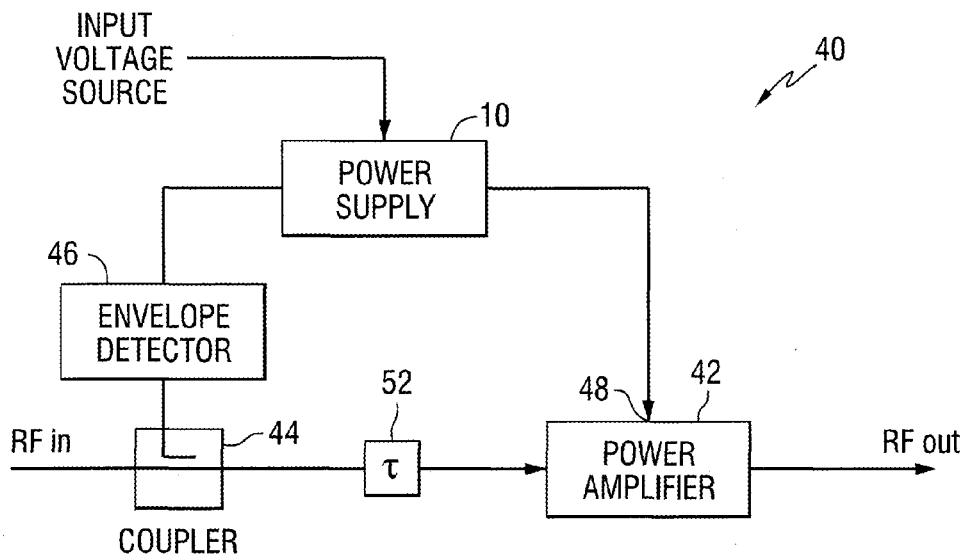

FIG. 7 is a simplified block diagram of the power amplifier system 40 according to another embodiment of the present invention. In order to increase the modulation bandwidth, in the embodiment of FIG. 7 the feedback signal 50 of the power supply 10 (see FIG. 6) is omitted. Thus, the power supply 10 of FIG. 7 may be considered an "open-loop" power supply. By removing the feedback loop, a delay becomes apparent in the system. This delay is introduced by the PWM generation circuit, gate drivers and power transistors of the power supply 10 (for embodiments of the power supply 10 with no discrete output capacitor, the output filter does not introduce any meaningful delay as it was explained previously). In order to match the rf signal envelope with the modulated supply voltage, a matching delay may be introduced in the signal driving the rf power amplifier by a delay circuit 52. This modification can be also viewed as trading delay for bandwidth, as well-known concept in the art.

Figure 8:
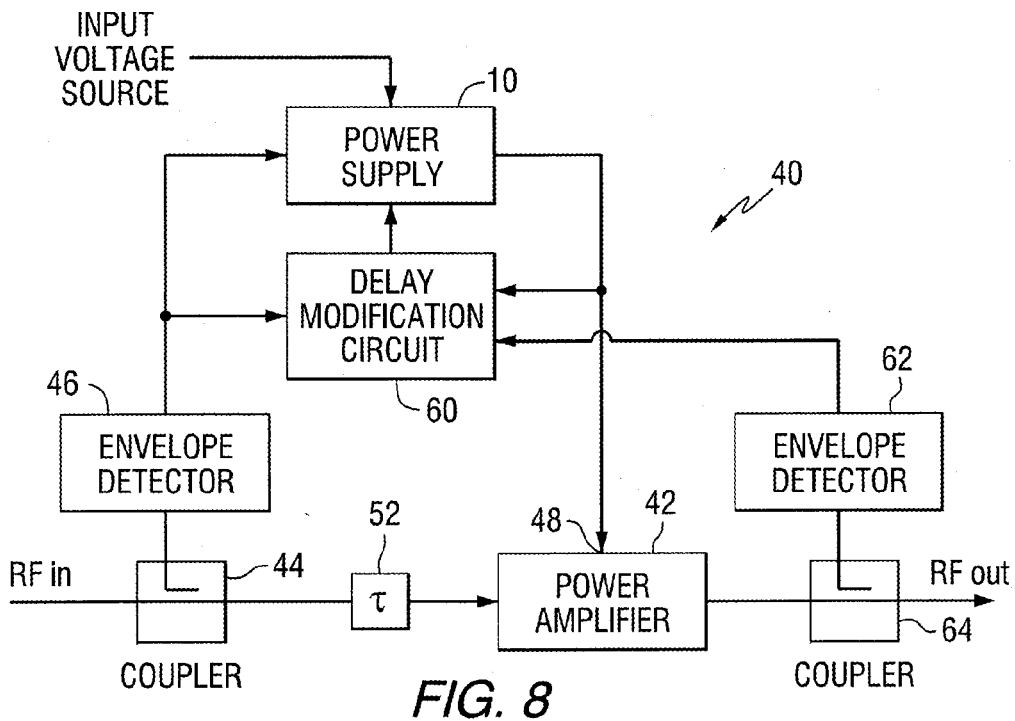

FIG. 8 shows another embodiment of the power amplifier system 40. The embodiment of FIG. 8 is essentially the same as FIG. 7 with the addition of the delay modification circuit 60. The delay introduced by the power supply 10 is to the first degree constant, regardless of the spectrum of the processed signal, thanks to the open loop arrangement for the power supply 10. This delay, however, experiences exact value uncertainty and drifts. High frequency modulation benefits from an arrangement in which such delay would be adjusted to best match the desired value. This role may be performed by the delay modification circuit 60, which may be based on Phase Lock Loop principle or other circuit techniques known in the art. The delay modification circuit 60 provides a delay adjustment signal to the power supply 10 so that it has the desired value. As shown in FIG. 8, the delay modification circuit 60 may receive input and/or output envelope signals from input and output envelope detectors 46, 62. A sample of the output RF signal may be provided to the output envelope detector 62 by an output coupler 64.

Figure 9:
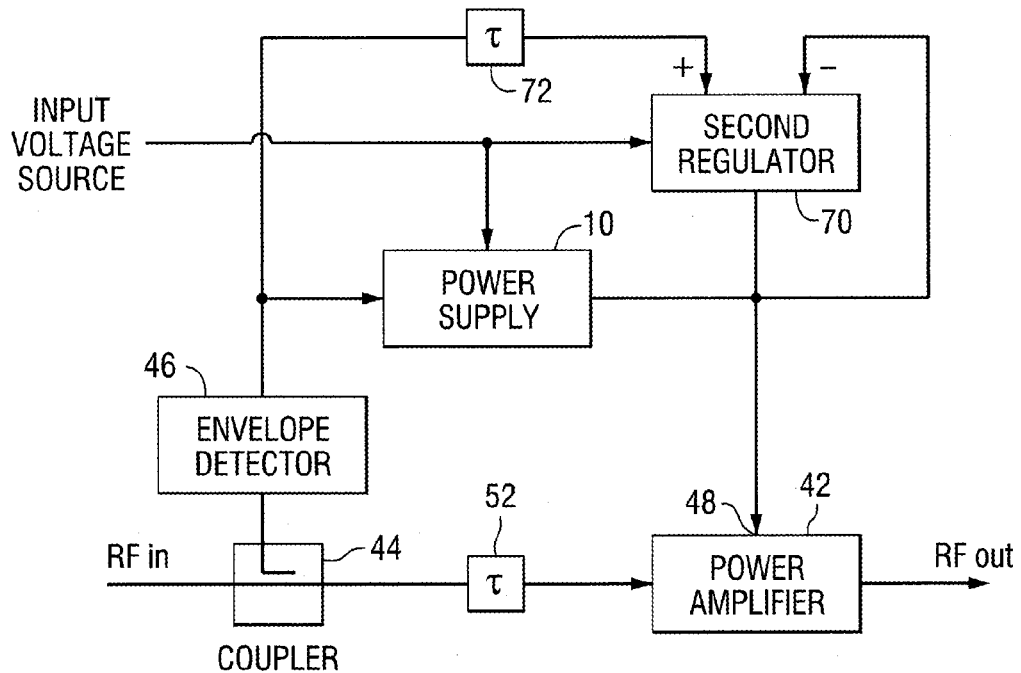

FIG. 9 shows another embodiment of the power amplifier system 40. In this embodiment, a second, closed-loop regulator 70 is added in parallel to the main switching, open-loop regulator (i.e., the power supply 10). The second regulator 70 is preferably realized as a linear regulator (series pass or shunt) or as a switching regulator operating at a substantially higher switching frequency than the main switching regulator 10 (and hence having much higher bandwidth). The purpose of the second regulator 70 is to provide fast and precise adjustment of the regulated voltage supplied to the power amplifier 42. The role of the second regulator 70 in frequency domain may be described as providing regulation in the part of the frequency spectrum exceeding the bandwidth of the main switching regulator 10. The second regulator 70, by having a substantially higher switching frequency, may have substantially lower efficiency, yet overall efficiency of the system 40 may be affected only to a small degree due to the relatively minor contribution of the highest frequencies in the overall power density spectrum.

The second regulator 70 may operate in a closed loop arrangement, as shown in FIG. 9, to provide accurate response. If matched with an open-loop switching converter 10 (as shown in FIG. 9), a delay circuit 72 is preferably used to provide the second regulator 70 with a delay in its control signal that is matched with the delay from the delay circuit 52 introduced in the rf signal path. The closed loop arrangement of the second regulator 70 does not cause the stability problems mentioned before because of the much smaller internal delays due to, for example, the higher switching frequency or the linear structure of the second regulator 70. This system configuration can be understood as a combination of a highly efficient switching regulator (i.e., power supply 10) delivering the bulk of the power with coarse regulation and a possibly less efficient, fast regulator (i.e., second regulator 70) that provides fine regulation.

Figure 10:
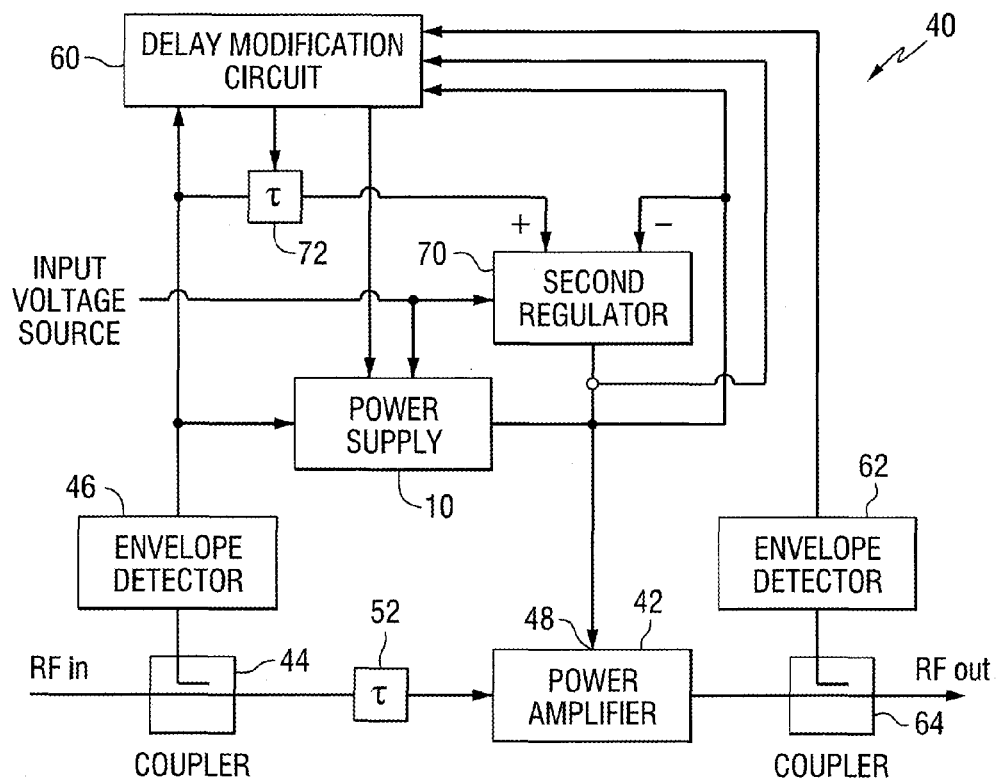

FIG. 10 provides yet another embodiment of the power amplifier system 40. The embodiment of FIG. 10 is similar to that of FIG. 9, except that in FIG. 10 a delay modification circuit 60 is used, like in the embodiment of FIG. 8. In this scheme, the delay of the main switching regulator (power supply 10) and the delay of the second regulator 70 are adjusted by the delay modification circuit 60 to assure the best matching between the input rf envelope and modulated supply voltage. The delay modification circuit 60 may also provide feedback to the delay circuit 72 if necessary so that the delays of the delay circuits 52, 72 match.

Figure 11:
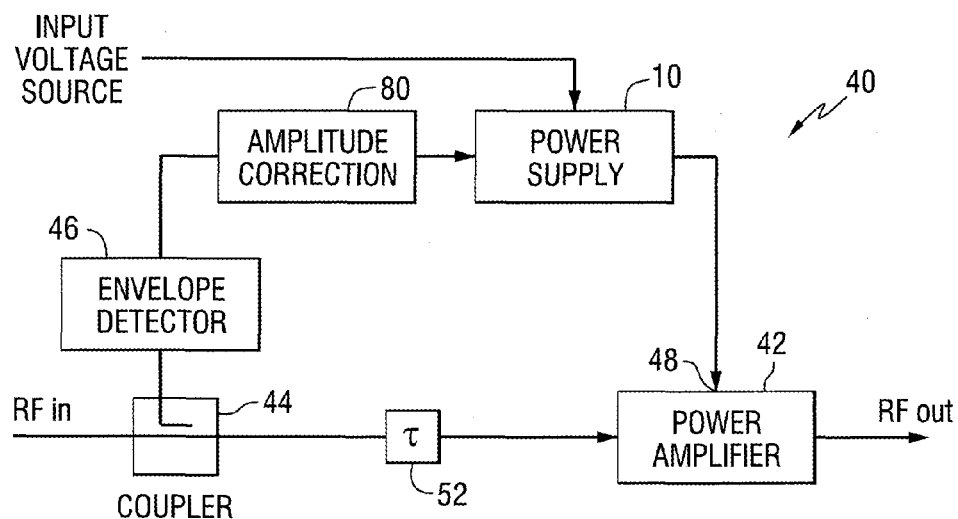

FIG. 11 shows an additional embodiment of the system 40 including an amplitude correction circuit 80 connected between the envelope detector 46 and the power supply 10. The amplitude correction circuit 80 may modify the signal of the envelope detector 46 to correct for non-ideal characteristics of the power supply 10. This may serve to increase the accuracy of the system 40, while maintaining the advantages of operating the system 40 in an open-loop configuration.

It will be appreciated that, in practice, the output voltage (Vout) of the power supply 10 is reduced by an error voltage (Vd) due to non-ideal characteristics in the system 40 (e.g., component resistance, etc.). Accordingly, the output voltage (Vout) may be restated as shown by Equation 2 below:

$$V\text{out}(t) = (V\text{in} * k(t)/N) - Vd \qquad (2)$$

The amplitude correction circuit 80 may modify the signal of the envelope detector 46 in a way that compensates for the non-ideal characteristics of the open loop system 40 of FIG. 11 (e.g., Vd). For example, the amplitude correction circuit 80 may include a scaling factor based on the instantaneous value of the desired output voltage, its rate of change, the non-ideal characteristics to be compensated, or any combination of these factors. Also, fast changing signals may experience amplitude reduction due to various non-ideal properties of the open loop system like the delays propagation of the control signals, delays in the power switching circuit, finite slope of the voltage switching of individual modules and limiting impact of the impedance of the power path. In this case it may be beneficial to correct the output voltage by the amount depending on the rate and direction of the desired output voltage change. According to various embodiments, the amplitude correction circuit 80 may be implemented digitally (e.g., as a look-up table) or in an analog manner (e.g., a diode-based circuit).

Figure 12:
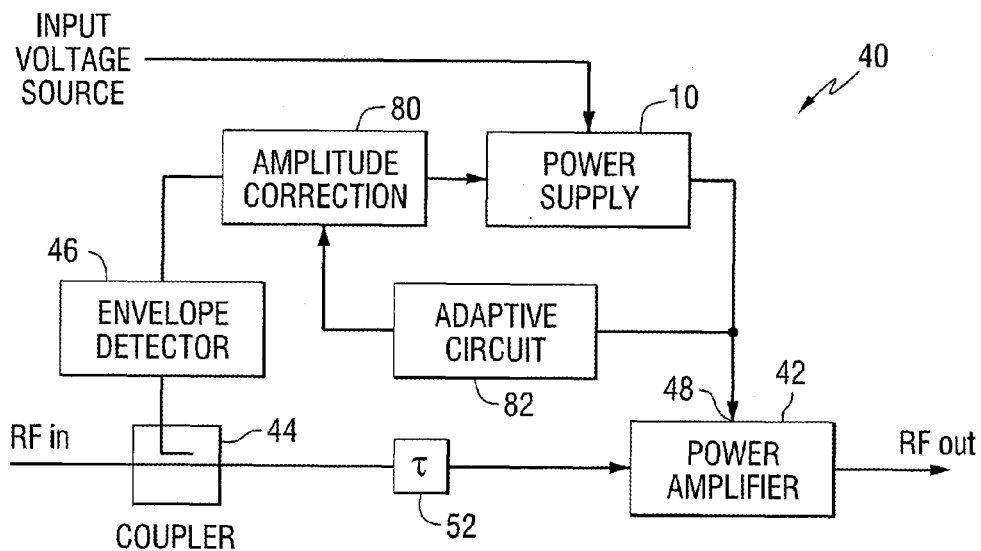

An adaptive circuit 82 may be added to the system 40 in an open-loop configuration, for example, as shown in FIG. 12. The adaptive circuit 82 may be connected between the output of the power supply 10 and the amplitude correction circuit 80. The adaptive circuit 82 may monitor the accuracy of the voltage produced by the switching power supply and modify the characteristic of the amplitude correction circuit 80 accordingly (e.g., by modifying the content of a look-up table). According to various embodiments, the adaptive circuit 82 may be omitted and its functionality implemented by the amplitude correction circuit 80. For example, a connection may be made between the output of the power supply 10 and the amplitude correction circuit 80. The amplitude correction circuit 80 may then modify its own characteristic based on the output of the power supply 10.

According to various embodiments, the system 40 may be configured such that corrections to the amplitude correction circuit 80 occur in a slow fashion. For example, the characteristic of the amplitude correction circuit 80 may gradually converge on a characteristic resulting in the smallest achievable distortion (e.g., over the course of a few seconds). The error signal for modifying the amplitude correction circuit 80 may be obtained from the envelope of the rf signal.

Figure 13:
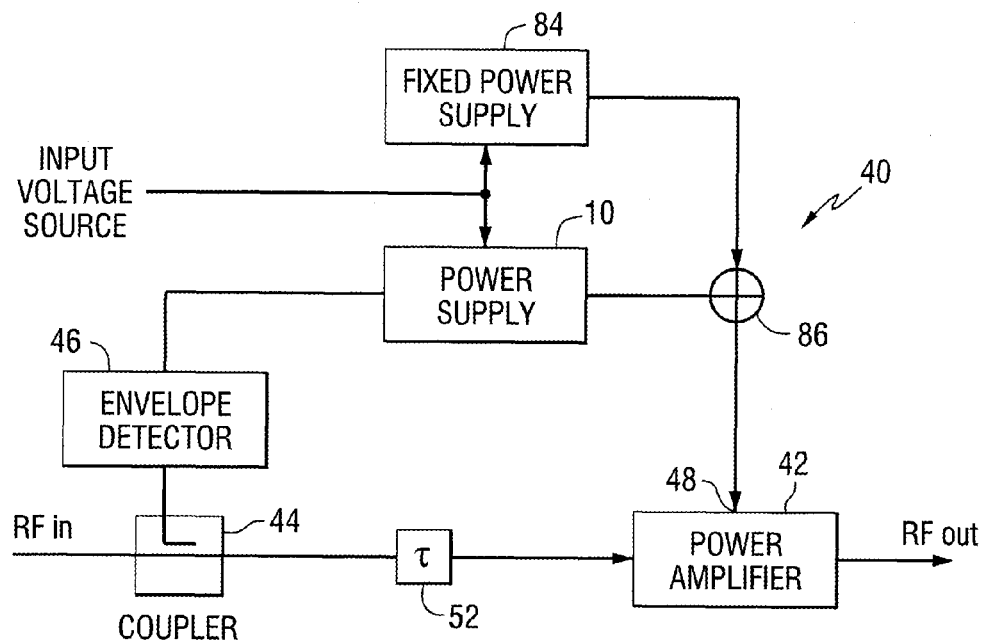
Figure 14:
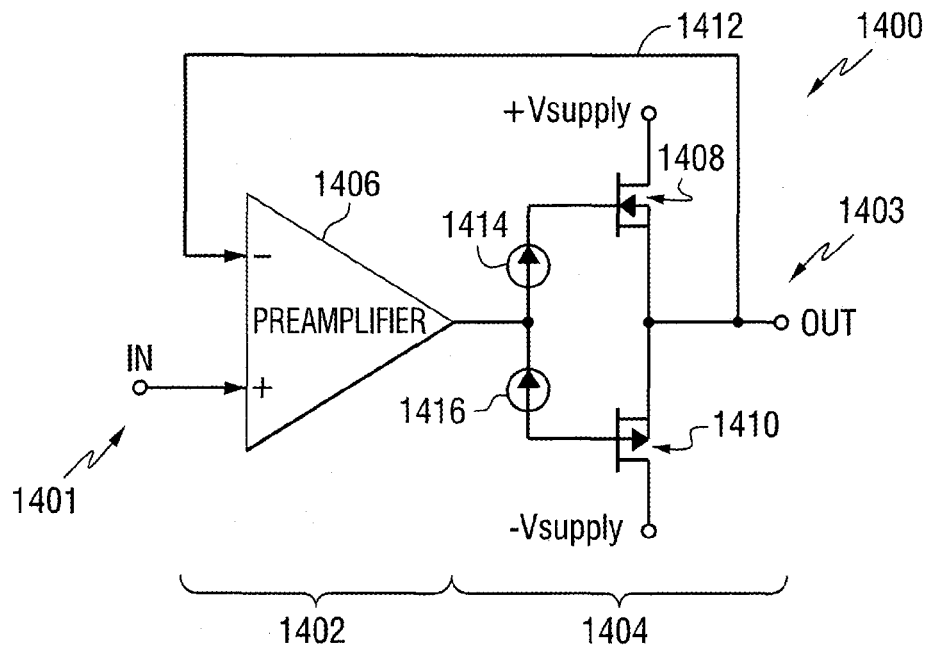
FIG. 14 illustrates a prior art linear regulator.

FIG. 13 shows an exemplary embodiment of the system 40 including a non-regulated (e.g., fixed) or slowly regulated power supply 84. The system 40 of FIG. 13 may be useful, for example, in configurations that do not require fast modulation of output voltage in the full range from zero to the maximum voltage or current. As shown in FIG. 13, the power supply 10 would be configured for operation covering a rapidly varying portion of the output range. The remaining portion would be covered by the fixed or slowly varying power supply 84. The outputs of the two power supplies 10, 84 may be summed, for example, by a summing circuit 86. In one example embodiment, fast modulation may be required between 12 and 28 volts. In this case, the power supply 84 may provide a fixed or slowly regulated signal of about 12 volts, while the power supply 10 may provide a fast modulated signal of between zero and 16 volts. The signals of the two power supplies 10, 84 may then be summed, resulting in a signal varying between 12 and 28 volts.

In various embodiments, it may be desirable to reduce the impact of the switching ripple of the power supply 10 on the rf signal. For example, the switching frequency of the power supply 10 may be periodically modified so as to distribute spurious frequencies over a wider bandwidth or shift the spurious signals to desired (e.g., less harmful) frequencies.

Figure 15:
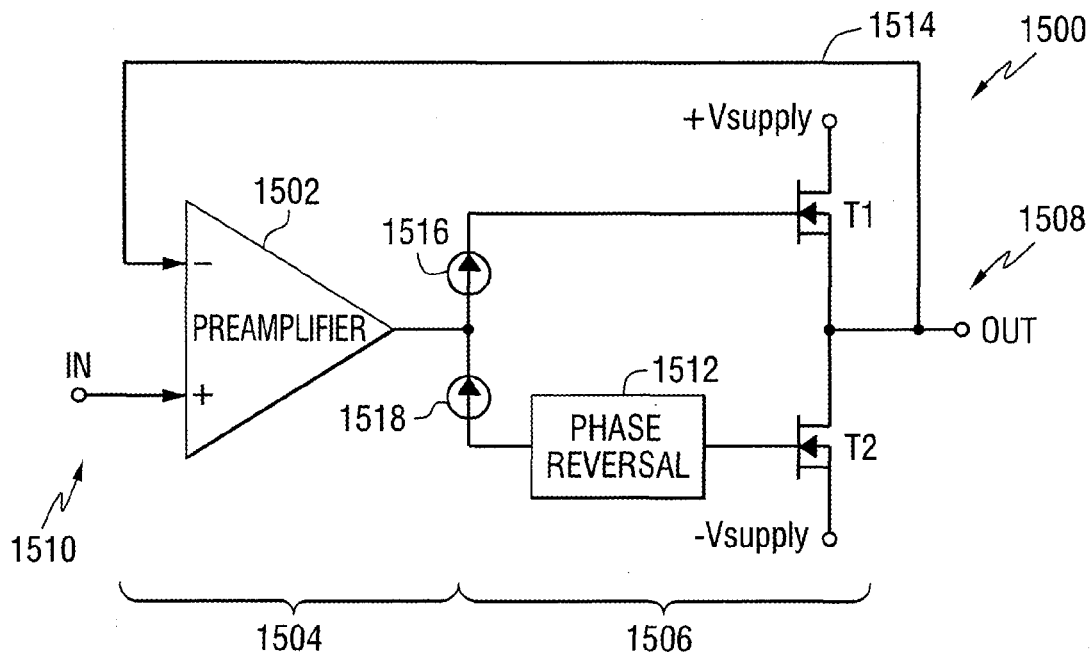
FIG. 15 illustrates one embodiment of a linear regulator.

FIG. 15 illustrates one embodiment of a linear regulator 1500 that may be used, for example, with the other regulator embodiments described herein. The linear regulator 1500 may be used as part of a hybrid linear-switching regulator, or may be used separately. According to various embodiments, the regulator 1500 comprises a preamplifier stage 1504 electrically connected to an output stage 1506. An input signal may be provided at input terminal 1510, while an output signal may be provided to a load at terminal 1508. In the embodiment shown in FIG. 15, the preamplifier stage 1504 comprises a single preamplifier 1502, although more than one preamplifier may be included in parallel or series. The preamplifier 1502 may perform all stages of amplification prior to the output stage 1506. For example, the preamplifier 1502 may perform low and medium power amplification.

The output stage 1506 may comprise a pair of transistors T1, T2 and a phase reversal circuit 1512. The transistors T1 and T2 may be any suitable type of transistor including, for example, Metal Oxide Field Effect Transistors (MOSFET's), Metal Semiconductor Field Effect Transistors (MESFET's), other field effect transistors (FET's), or bipolar transistors. T1 and T2 may be constructed from any suitable semiconductor material or materials including, for example, silicon, gallium arsenide (GaAs), etc. Biasing components 1516, 1518 may provide suitable biasing to T1 and T2. For example, when T1 and T2 are field effect transistors (FET's), the biasing components 1516, 1518 may act as simple voltage sources to provide at least a threshold voltage at the respective gates. In one embodiment, biasing components 1516, 1518 may comprise diodes with their respective anodes connected in series to the positive and negative supply voltages via resistors. Various other configurations may be used, however, including Zener diode circuits, resistor-capacitor circuits, etc. In embodiments where T1 and T2 are bipolar or other current-biased transistors, biasing components 1516, 1518 may provide at least a threshold current to the respective bases. For example, the biasing components 1516, 1518 may include resistor or transistor-based circuits.

According to various embodiments, T1 and T2 may be radio frequency (RF) transistors. RF transistors may be optimized for high frequency ac operation in the linear region. This may be accomplished by minimizing the parasitic capacitance at all of the transistor terminals and the parasitic resistance at the gate or base. This may allow RF transistors to change their operating state relatively quickly. One adverse result of the optimization of RF transistors is that they often suffer relatively higher losses when conducting direct current (dc). This is because of their relatively high on-resistance. In contrast to RF transistors, power transistors may be optimized to conduct current with minimal losses, for example, by minimizing on-resistance. Power transistors, however, may have higher parasitic capacitances and parasitic resistance at the gate or base, making it difficult for power transistors to change states relatively quickly. For example, a medium-size power transistor designed to dissipate between a few and a few tens of watts may have an on-resistance of about four to twenty mohms. A similarly sized 60V RF transistor may have an input capacitance of between about 20 and 200 pf and a feedback capacitance of between about 0.5 and 10 pf. These ranges are provided for example purposes only, and are not intended to be limiting.

According to various embodiments, T1 and T2 may be of the same type. For example, if T1 and T2 are FET's, then they may both be either n-type FET's or p-type FET's. If T1 and T2 are bipolar transistors, then they may both be either npn or pnp-type. T1 and T2 may also be radio frequency (RF) transistors.

The transistors T1 and T2 may be electrically connected in series between a positive supply voltage and a negative supply voltage. The output terminal 1508 of the regulator 1500 may be positioned at the common node of the transistors T1 and T2. In embodiments where T1 and T2 are FET's, the drain of T1 may be electrically connected to the positive supply voltage; the source of T1 may be electrically connected to the drain of T2 and the source of T2 may be electrically connected to the negative supply voltage. In embodiments where T1 and T2 are bipolar transistors, the collector of T1 may be electrically connected to the positive supply voltage; the emitter of T1 may be electrically connected to the collector of T2; and the emitter of T2 may be electrically connected to the negative supply voltage. A feedback line 1514 may provide a feedback signal from the output terminal 1508 to the preamplifier stage 1504. The supply voltages may be chosen to be any suitable value including, for example, 12 volts, 15 volts, 5 volts, ground, etc.

The biasing terminals of T1 and T2 (e.g., for FET's, the gates and for bipolar transistors, the bases) may be electrically connected to the output of the preamplifier stage 1504. In embodiments where T1 and T2 are of the same type, as shown in FIG. 15, T2 tends to reverse the phase of the signal received from the preamplifier stage 1504. Accordingly, a phase reversal circuit 1512 may be electrically connected between the preamplifier stage 1502 and the biasing terminal of T2. The phase reversal circuit 1512 may serve to shift the phase of the preamplifier stage output before it reaches T2. For example, the phase reversal circuit 1512 may shift the phase of the preamplifier stage output by about 180° before the signal encounters T2. As a result, T1 and T2 may operate out of phase with one another causing T1 to source current when the input voltage is above zero and T2 to sink current when input voltage is below zero.

The phase reversal circuit 1512 may be implemented by any suitable circuit component or components. For example, the phase reversal circuit 1512 may comprise an inverting amplifier configuration with unity gain. One example of such a configuration could include an operational amplifier (Op-Amp) configured to invert and coupled with suitable components (e.g., resistors, capacitors, etc.) to bring about unity gain. Another example of such a configuration could include a FET with its drain electrically connected to the positive supply voltage via a resistor, its gate electrically connected to the output of the preamplifier stage 1502 and its source electrical connected to the biasing terminal of T2, for example via a second resistor. The resistances of the resistors could be chosen to achieve unity gain.

According to various embodiments, the phase reversal circuit 1512 may have a non-unity gain associated with it. For example, in the regulator 1500 as shown in FIG. 15, T1 and T2 may exhibit substantially different voltage gains. The gain of the phase reversal circuit 1512 may be selected, for example, such that the gain of the phase reversal circuit 1512 plus T2 is substantially equal to the gain of T1.

Figure 16:
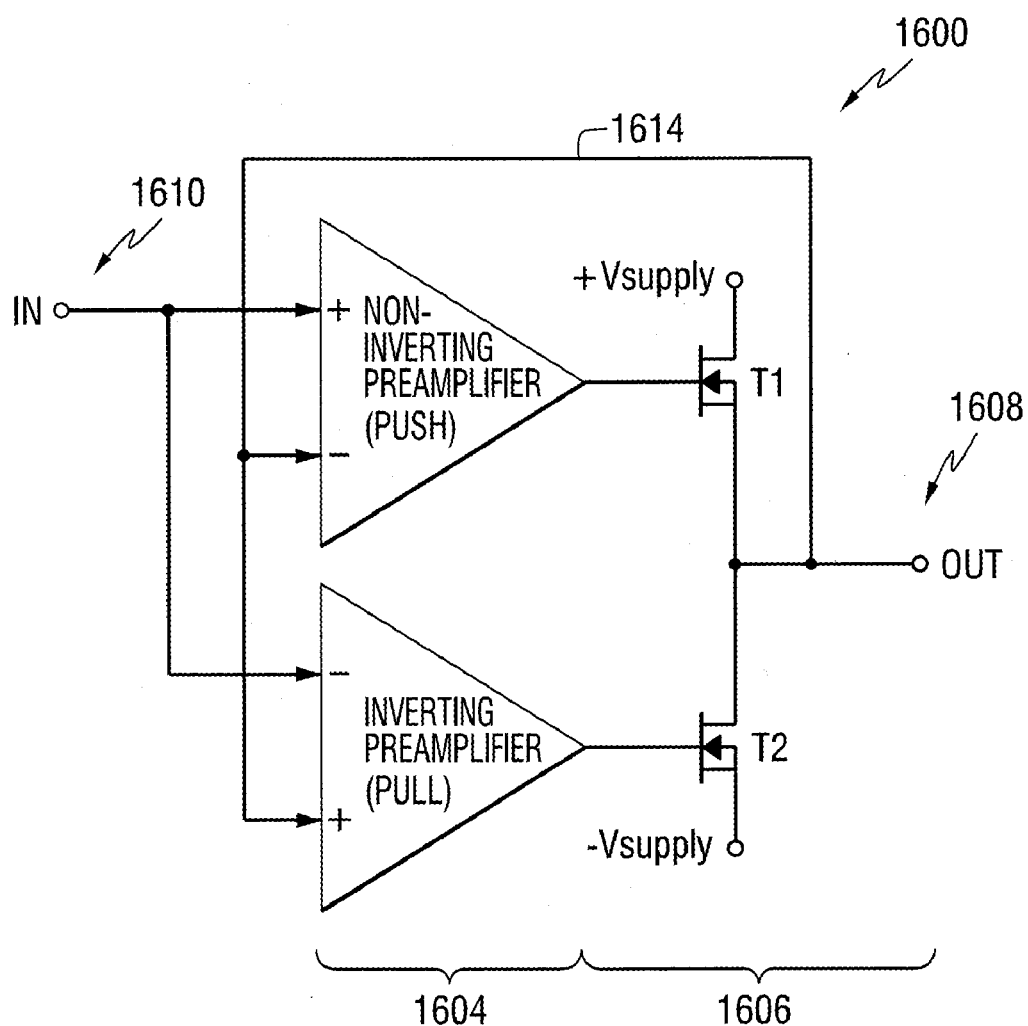
FIG. 16 illustrates one embodiment of a linear regulator having a preamplifier stage comprising a pair of preamplifiers.

FIG. 16 illustrates one embodiment of a linear regulator 1600 having a preamplifier stage 1604 comprising a pair of preamplifiers 1602 and 1603. The regulator 1600 may be used as part of a hybrid linear-switching regulator, or may be used separately. A non-inverting preamplifier 1602 may receive the signal from input terminal 1610 at a non-inverting input, while an inverting preamplifier 1603 may receive the signal from the input terminal 1610 at an inverting input. Accordingly, the outputs of the respective preamplifiers 1602, 1603 may be reversed in phase.

Also, the outputs of the respective preamplifiers 1602, 1603 may be electrically connected to the biasing terminals of T1 and T2. The output of the non-inverting preamplifier 1602 may be electrically connected to the biasing terminal of T1, while the output of the inverting preamplifier 1603 may be electrically connected to the biasing terminal of T2. Because the output of the preamplifier 1603 is inverted, a phase reversal circuit, such as circuit 1512 above, may not be necessary in the regulator 1600. Also, because T1 and T2 are driven by separate preamplifiers 1602, 1603, any differences between the voltage gains of T1 and T2 may be addressed by modifying the gains of the respective preamplifiers 1602, 1603. In various embodiments, T1 and T2 may be otherwise connected in a manner similar to that shown above with respect to the regulator 1500. For example, T1 and T2 may be electrically connected in series between a positive supply voltage and a negative supply voltage. Again, the output terminal 1608 of the regulator 1600 may be positioned at the common node of T1 and T2; and a feedback line 1614 may provide a feedback signal from the output terminal 1608 to the preamplifier stage 1604.

Figure 17:
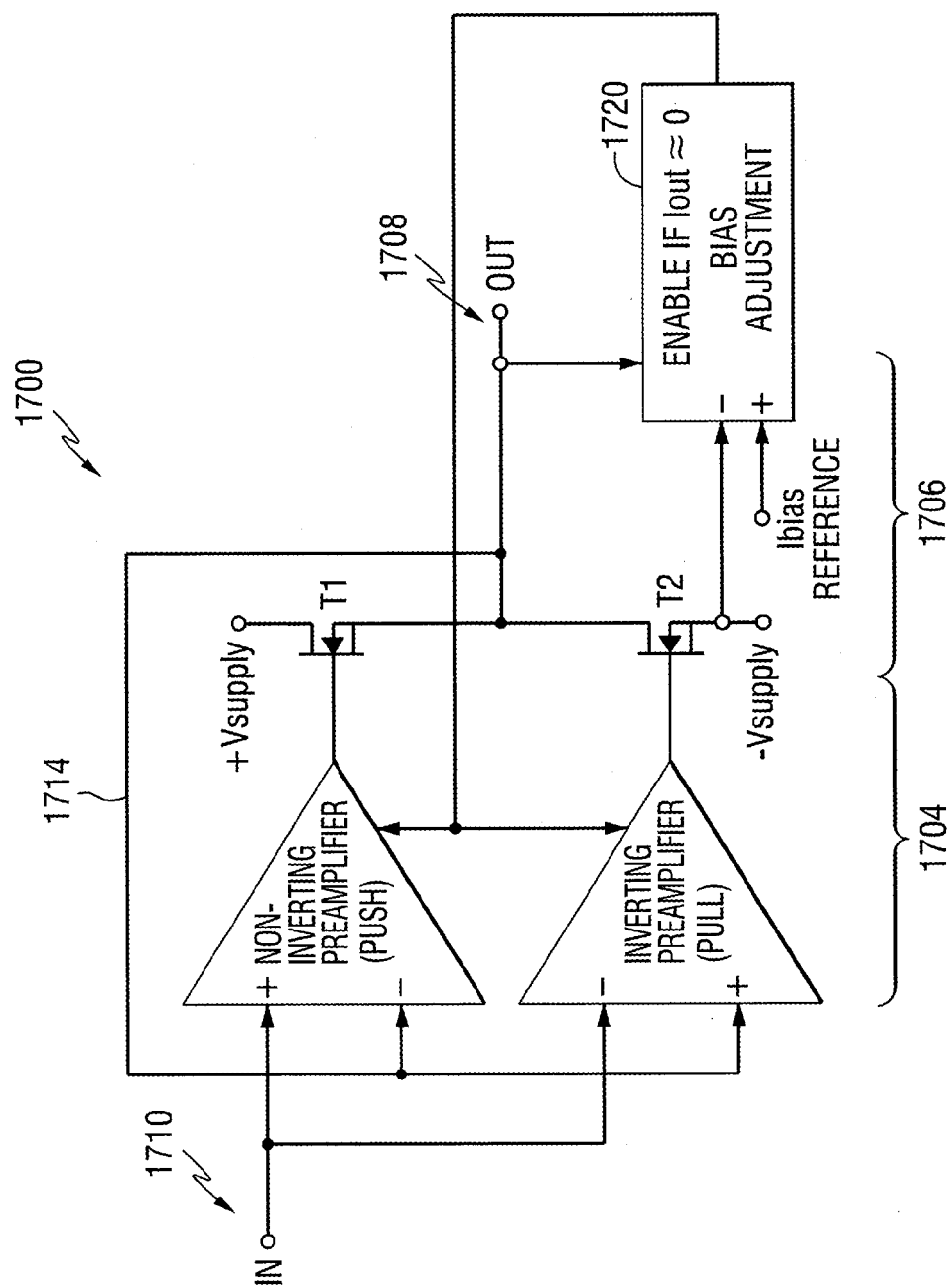
FIG. 17 illustrates one embodiment of a linear regulator comprising a bias adjustment circuit.

FIG. 17 illustrates one embodiment of a linear regulator 1700 comprising a bias adjustment circuit 1720. The regulator 1700 may be used as part of a hybrid linear-switching regulator, or may be used separately. The bias adjustment circuit 1720 may correct for bias current drift. The regulator 1700 may comprise a preamplifier stage 1704 and an output stage 1706. FIG. 17 illustrates a preamplifier stage 1704 and output stage 1706 as described above with respect to the regulator 1600. It will be appreciated, however, than any suitable preamplifier and output stage configuration may be used including, for example, the preamplifier stage 1402 and output stage 1404 and/or the preamplifier stage 1504 and output stage 1506.

The bias adjustment circuit 1720 may receive as inputs a reference bias current, an indication of the current biasing the transistors T1 and T2, as well as an indication of the output current. The bias current may be measured at any suitable point within the circuit including, for example, between the transistor T2 and the negative supply voltage, or between the transistor T1 and the positive supply voltage. The current at these locations may be an accurate representation of the bias current when the output current is equal to about zero. The output current may be equal to about zero during operation of the regulator 1700, for example, when the regulator 1700 is used in conjunction with a switching regulator to form a hybrid regulator. In such a configuration, the switching regulator would drive the output for relatively low frequency signals, while the linear regulator 1700 would drive the output for relatively high frequency signals. When the input signal lacks a relatively high frequency component, and the voltage produced by the switching regulator is accurate, the output current of the linear regulator 1700 would be about zero, allowing the bias current of the output stage 1706 to be measured. For example, the circuit 1720 may sense the bias current and compare it to the reference bias current. If the bias current does not match, or otherwise have a predetermined relationship to the reference bias current, then the circuit 1720 may make adjustments to the regulator 400 to correct the bias current. For example, the circuit 1720 may modify a dc shift of the output of the preamplifier stage 1704.

Figure 17A:
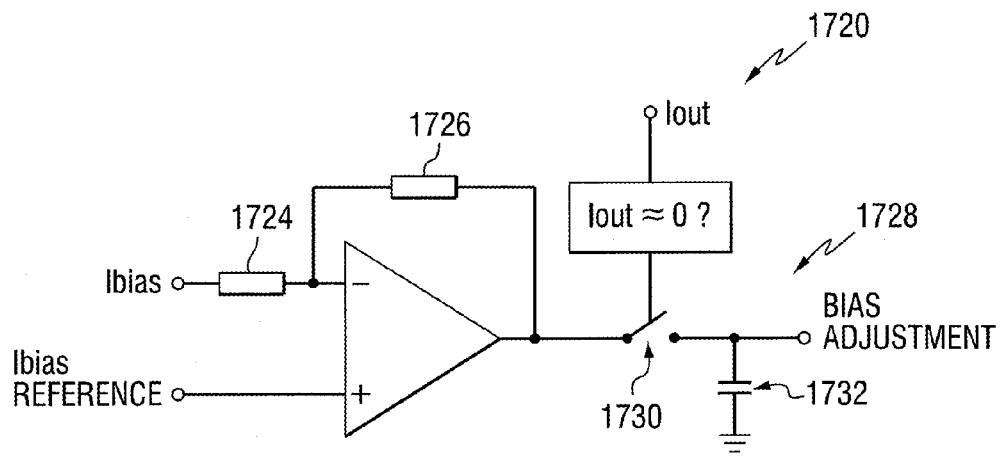
FIG. 17A illustrates one embodiment of an analog bias adjustment circuit 420

The bias adjustment circuit 1720 may be designed according to any suitable configuration having the desired functionality. For example, the bias adjustment circuit may comprise a microprocessor, state machine, or other digital circuit. According to other embodiments, the circuit 1720 may be implemented as an analog circuit. FIG. 17A illustrates one embodiment of an analog bias adjustment circuit 1720. The circuit 1720 may include op-amp 1722 in a reversing amplifier configuration. A signal representing the reference bias current (Ibias reference) may be applied to the positive input of the op-amp 1722 and a signal representing the measured bias current (Ibias) may be applied to the negative input of an op-amp 1722 via an appropriate gain setting network including elements 1724, 1726. A sample and hold circuit 1728 may be positioned at the output of an op-amp 1722. For example, the sample and hold circuit 1728 may comprise a switch 1730 and capacitor 1732, as shown. The switch 1730 may be activated (made conductive) only when the output current is essentially equal to zero, which updates the voltage of the capacitor 1732. During the periods when output current of the linear regulator 1700 is not essentially equal to zero the switch 1730 is deactivated (in high impedance) thus effectively isolating the capacitor 1732. This capacitor 1732 maintains the voltage until the next instance during which output current is essentially equal zero and its voltage can be updated.

Figure 18:
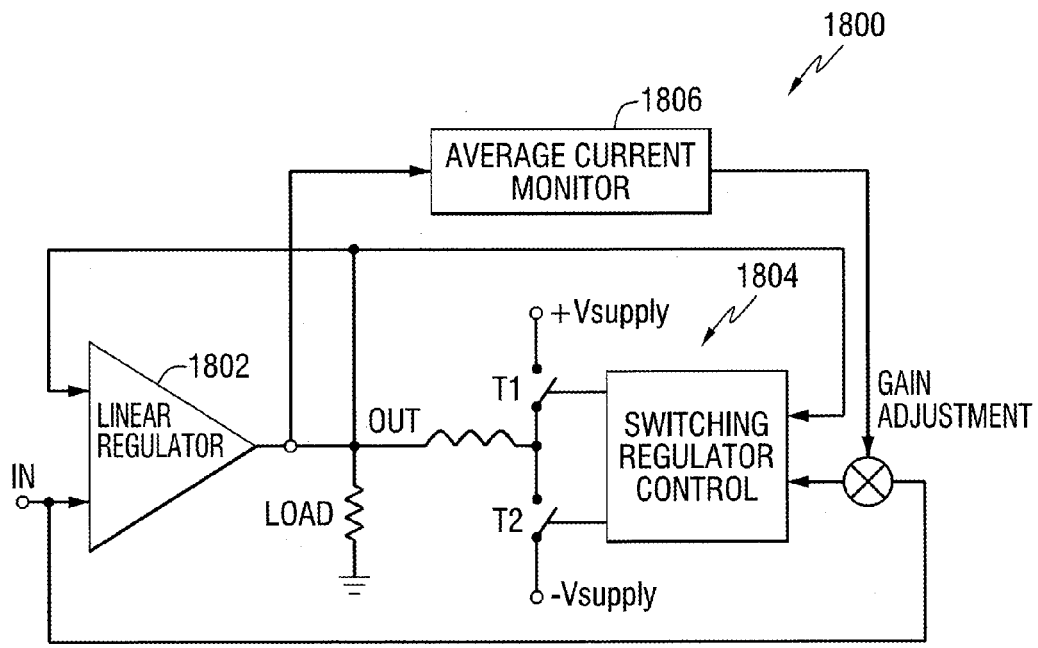
FIG. 18 illustrates one embodiment of a hybrid regulator comprising a linear regulator, a switching regulator and an average current monitor.

FIG. 18 illustrates one embodiment of a hybrid regulator 1800 comprising a linear regulator 1802, a switching regulator 1804 and an average current monitor 1806. The linear regulator 1802 may be any suitable type of linear regulator including, for example, one or more of the linear regulators 1400, 1500, 1600 and 1700 described above. The switching regulator 1804 may be any suitable type of switching regulator or any type regulator designed to operate in high current applications.

In a hybrid regulator, it may be desirable to match the voltage output of the linear regulator 1802 and the switching regulator 1804 to prevent one regulator (e.g., the switching regulator 1804) from driving the output and negating the contribution of the other regulator. The voltage match between the regulators 1802, 1804 may be monitored by monitoring the average current delivered to a load. A positive average current coming out of the linear regulator 1802 may indicate that the voltage of the switching regulator 1804 is too low, on average, while a negative average current coming out of the linear regulator 1802 may indicate that the voltage of the switching regulator 1804 is to high, on average. The average current monitor circuit 1806 may monitor the average current and make appropriate adjustments to the gain of the switching regulator 1804, as shown in FIG. 18. For example, if the average current from the linear regulator 1802 is more negative than a first predetermined threshold, then the average current monitor circuit 1806 may reduce the gain of the switching regulator 1804. If the average current is more positive than a second predetermined threshold, then the circuit 1806 may increase the gain of the switching regulator 1804. According to various embodiments, the first predetermined threshold may be equal to the second predetermined threshold. One or both of the predetermined thresholds may be equal to zero. It will be appreciated that the circuit 1806 may make adjustments to the gain of the linear regulator 1802 in addition to or instead of adjusting the switching regulator. In this case, the direction of the change would be reversed.

Figure 19:
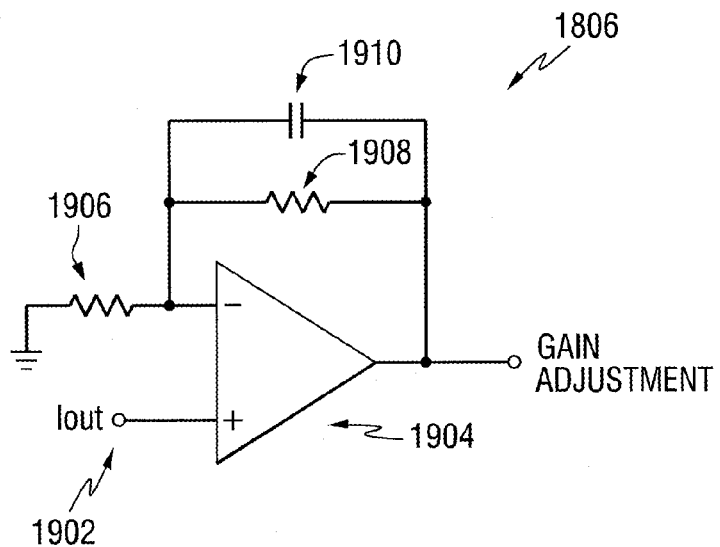
FIG. 19 illustrates one embodiment of an analog current monitor circuit.

The average current monitor circuit 1806 may be implemented according to any suitable design. For example, the circuit 1806 may be implemented as a microprocessor, state machine or other digital circuit having the functionality described above. Also, according to various embodiments, the current monitor circuit 1806 may be implemented as an analog circuit. For example, FIG. 19 illustrates one embodiment of an analog current monitor circuit 1806. The circuit 1806 may include an operational amplifier 1904 (op-amp) in a non-inverting amplifier configuration with a capacitor 1910 in a feedback path performing time averaging. A signal indicative of the output current is provided at the non-inverting input 1902 of the op-amp 1904. For example, the signal may the result of applying the output current to a current sensing resistor (not shown). The values of the resistors 1906, 1908 and the capacitor 1910 may be selected to cause the circuit 1806 to make an appropriately scaled adjustment to the gain of the regulator 1804. The value of the capacitor 1910 may be selected to choose the time span over which the time-averaging is performed. When the time average of the output current is positive, an appropriate positive adjustment to the gain of the regulator 1804 may be performed. When the time average of the output current is negative, then a negative adjustment (reduction) of the gain of the regulator 1804 may be performed.

Figure 20:
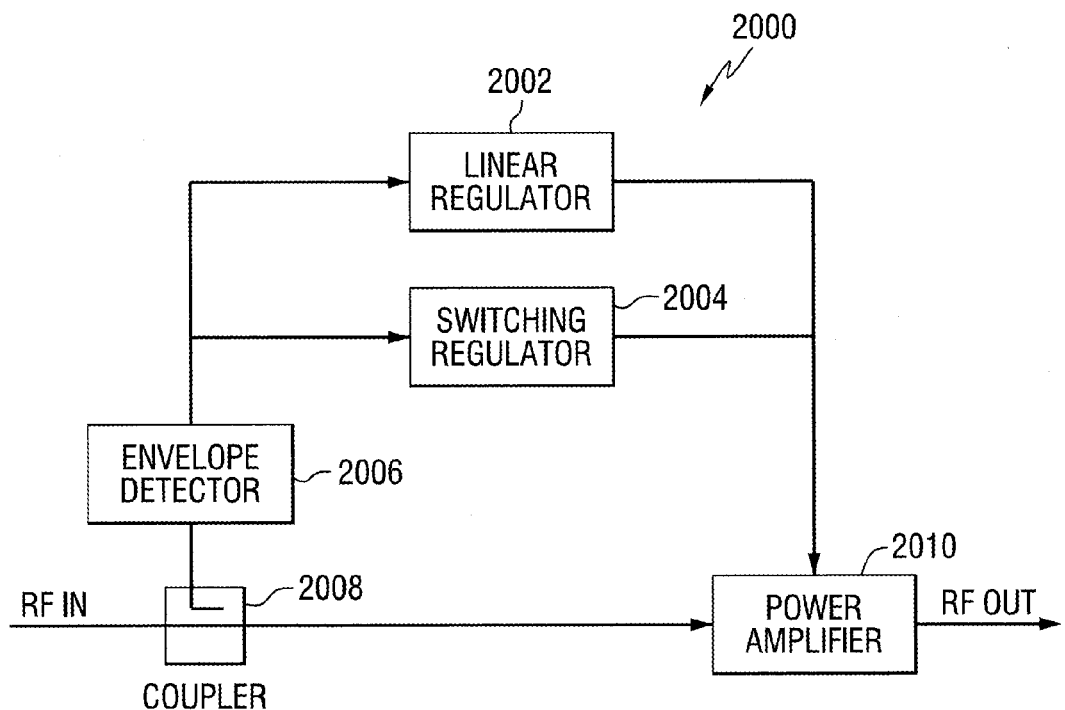
FIG. 20 illustrates one embodiment of a hybrid linear-switching regulator.

FIG. 20 illustrates one embodiment of a hybrid linear-switching regulator 2000. The regulator 200 may comprise a linear regulator 2002 and a switching regulator 2004. The switching regulator 2004 may comprise any suitable kind of switching regulator. In various embodiments, the switching regulator 2004 may comprise a plurality of switch-mode modules arranged in parallel and controlled, for example, as described above with respect to FIGS. 1-5. The linear regulator 2002 may comprise any suitable type of linear regulator. For example, the linear regulator may be configured as described above. The regulators 2002, 2004 may be operated in various open or closed loop configurations. For example, the switching regulator 2004 may be configured to operate in an open-loop configuration while the linear regulator 2002 may be configured to operate in a closed-loop configuration. When one or both of the regulators 2002, 2004 are operated in an open-loop configuration, applicable delays may be introduced to the regulator 2000, for example, as described above.

Various embodiments are directed to a power supply for providing a modulated output voltage to a load. According to various embodiments, the power supply comprises a plurality of parallel-connected switch-mode power modules and a controller. The controller is connected to each of the power modules and is for controlling the duty cycles of the respective power modules such that the power modules have a common duty cycle in steady state, but in a phase-shifted or "interleaved" manner. In addition, the controller is for controlling the output voltage of the power converter by controlling the ratio of power modules in the forward state at a time to the total number of power modules. In this way, by providing a sufficiently large number of power modules, arbitrarily low output voltage amplitudes and intra-level oscillations can be achieved. Further, the rate of modulation of the output voltage can exceed the switching frequency of the power modules. This makes embodiments of the power supply suitable for the dynamic source voltage requirements of rf linear power amplifiers and other applications that require fast source voltage modulation.

According to various implementations, the power modules do not include a discrete output filter capacitor. Also, the power modules may comprise any of a number of switch-mode topologies, including buck, boost or buck-boost converters and converters derived from those topologies. Also, the power modules may be voltage-fed or current-fed.

To further enhance the modulation frequency of the power supply, modulation of the output voltage can be obtained without the use of voltage feedback. This is possible because the power supply preferably has no or very little output capacitance. This, in turn, results in a flat gain characteristic of the power stage up to the maximum modulation frequency, which may be above the switching frequency of the power supply. If so, the amplitude of the output voltage will follow the command signal reference (average duty cycle) with reasonable accuracy in an open loop arrangement. Such an open loop arrangement, in turn, removes the problem of potential instability and difficulties with compensating the closed loop system caused by inherent delays in the power processing path of the switching converter. As a result, much higher modulation frequencies can be achieved.

In some open loop systems, an amplitude correction circuit may be included to correct for non-ideal characteristics of the power supply in an open-loop configuration. The amplitude correction circuit may modify the input signal to the power supply by a scaling factor, for example, based on the instantaneous value of desired output voltage, its rate of change, the non-idealities of the power supply, or any combination of these factors. According to various embodiments, an adaptive connection may be included, allowing the amplitude correction circuit to modify its scaling factors based on the output signal.

Further improvement in speed and accuracy can be achieved if a high bandwidth regulator in a closed loop arrangement (for example, a low efficiency linear regulator) is combined with an open-loop switched power supply as described above. This combination may allow high efficiency processing of a majority of the power density spectrum by the switched power supply and only the high end portion of the power density spectrum (plus possible accuracy adjustments) by the linear regulator. The control signal to the linear regulator is preferably delayed for a duration matching the delay of the open-loop switching power supply.

In order to compensate for uncertainty and drift of the delay introduced by the switching power supply, an adaptive mechanism for controlling the delay in the control signal to the linear regulator can be added to the circuit.

Some systems may include a non-regulated or slowly regulated power supply in conjunction with the fast modulating power supply described above. The fast modulation power supply may be configured to cover a rapidly varying portion of the output range, while the non-regulated or slowly regulated power supply may be configured to cover a fixed or slowly moving portion of the output range.

According to various embodiments, the output of the regulator 2000 may be configured to track the envelope of an incoming signal. For example, a coupler 2008 may provide a sample of an input signal to an envelope detector 2006. The envelope detector 2006 may modify the various regulators 2002, 2004 to conform their output to the envelope of the input signal. The output of the regulators 2002, 2004 may be provided to power an amplifier, such as power amplifier 2010.

Although the present invention has been described herein with respect to certain embodiments, those of ordinary skill in the art will recognize that many modifications and variations of the present invention may be implemented. For example, as explained above, current-fed power modules may be used. Also, in embodiments of the power amplifier system 40 such as shown in FIGS. 8-10, other types of switching power supplies besides those described herein in connection with FIGS. 1-5 may be used as the open-loop power supply 10. The foregoing description and the following claims are intended to cover all such modifications and variations.

What is claimed is:

1. A power amplifier system comprising:
    a power amplifier for amplifying an input signal;
    an amplitude correction circuit configured to generate a corrected envelope signal from an input envelope signal that represents an envelope of the input signal, wherein generating the corrected envelope signal comprises applying a scaling factor to the envelope signal; and
    an open-loop switching regulator connected to the power amplifier and the amplitude correction circuit, wherein the open-loop switching regulator is for powering the power amplifier based on the corrected envelope signal, wherein the corrected envelope signal generated by the amplitude correction circuit is a function of the input envelope signal and an error voltage of the open-loop switching regulator.

2. The power amplifier system of claim 1, wherein the amplitude correction circuit comprises a look-up table, the look-up table comprising a plurality of values for the input envelope signal and a corresponding plurality of values for the corrected envelope signal.

3. The power amplifier system of claim 1, wherein the amplitude correction circuit is an analog circuit comprising a plurality of diodes.

4. The power amplifier system of claim 1, further comprising an envelope detector circuit to generate the input envelope signal, wherein the envelope detector circuit and the amplitude correction circuit are implemented as a single circuit.

5. The power amplifier system of claim 1, wherein the scaling factor is based on the desired output of the power amplifier system.

6. The power amplifier system of claim 1, further comprising an adaptive circuit, wherein the adaptive circuit is configured to:
    monitor an output of the switching regulator; and
    modify the amplitude correction circuit to generate the corrected envelope signal considering the output of the switching regulator.

7. The power amplifier system of claim 6, wherein modifying the amplitude correction circuit comprises modifying the value of at least one entry to a look-up table.

8. The power amplifier system of claim 1, wherein the switching regulator is configured to periodically modify a switching frequency of the switching regulator.

9. A circuit for use with a power amplifier that amplifies an input signal, the circuit comprising:

an amplitude correction circuit configured to generate a corrected envelope signal from an input envelope signal that represents an envelope of the input signal, wherein generating the corrected envelope signal comprises applying a scaling factor to the envelope signal; and an open-loop switching regulator connected to the amplitude correction circuit, wherein the open-loop switching regulator is for powering the power amplifier based on the corrected envelope signal, wherein the corrected envelope signal generated by the amplitude correction circuit is a function of the input envelope signal and an error voltage of the open-loop switching regulator.

10. A power amplifier system comprising:

an amplitude correction circuit configured to generate a corrected envelope signal from an input envelope signal that represents an envelope of an input signal;

an open-loop switching regulator connected to the power amplifier and the amplitude correction circuit, wherein the open-loop switching regulator is for powering the power amplifier based on the corrected envelope signal, wherein the corrected envelope signal generated by the amplitude correction circuit is a function of the input envelope signal and an error voltage of the open-loop switching regulator; and an adaptive circuit, wherein the adaptive circuit is configured to:

monitor an output of the switching regulator; and modify the amplitude correction circuit to generate the corrected envelope signal considering the output of the switching regulator.

11. The power amplifier system of claim 10, further comprising a power amplifier for amplifying the input signal.

12. The power amplifier system of claim 10, wherein modifying the amplitude correction circuit comprises modifying the value of at least one entry to a look-up table.

13. A power amplifier system comprising:

an amplitude correction circuit configured to generate a corrected envelope signal from an input envelope signal that represents an envelope of an input signal; and an open-loop switching regulator connected to the power amplifier and the amplitude correction circuit, wherein the open-loop switching regulator is for powering the power amplifier based on the corrected envelope signal, wherein the corrected envelope signal generated by the amplitude correction circuit is a function of the input envelope signal and an error voltage of the open-loop switching regulator, wherein the switching regulator is configured to periodically modify a switching frequency of the switching regulator.

14. The power amplifier system of claim 13, further comprising a power amplifier for amplifying the input signal.

* * * * *